United States Patent
Hamm

(10) Patent No.: US 6,781,685 B2
(45) Date of Patent: Aug. 24, 2004

(54) PROCESS AND DEVICE FOR IN-SITU DECONTAMINATION OF A EUV LITHOGRAPHY DEVICE

(75) Inventor: Uwe W. Hamm, Langenau (DE)

(73) Assignee: Carl Zeiss SMT AG, Oberkochen (DE)

( * ) Notice: Subject to any disclaimer, the term of this patent is extended or adjusted under 35 U.S.C. 154(b) by 389 days.

(21) Appl. No.: 10/010,135

(22) Filed: Dec. 6, 2001

(65) Prior Publication Data

US 2002/0083409 A1 Jun. 27, 2002

(30) Foreign Application Priority Data

Dec. 9, 2000 (DE) .......................................... 100 61 248

(51) Int. Cl.[7] .............................................. G01N 21/00
(52) U.S. Cl. .................................... 356/237.1; 438/597
(58) Field of Search ......................... 356/237.1–237.5, 356/73; 438/7, 597; 134/1; 250/222.2, 559.4

(56) References Cited

U.S. PATENT DOCUMENTS

| 4,614,427 A | 9/1986 | Koizumi et al. | |
|---|---|---|---|
| 5,024,968 A | 6/1991 | Engelsberg | |
| 6,620,630 B2 * | 9/2003 | Kishkovich et al. | 438/7 |
| 6,639,665 B2 * | 10/2003 | Poole | 356/300 |
| 2003/0037801 A1 * | 2/2003 | Bailey et al. | 134/1 |

FOREIGN PATENT DOCUMENTS

| EP | 421 745 | 1/1995 |
|---|---|---|
| EP | 660 188 | 6/1995 |
| EP | 874 283 | 10/1998 |
| EP | 1 143 491 | 10/2001 |
| JP | 09089650 | 4/1997 |
| JP | 11-329931 | 11/1999 |
| JP | 2000306807 | 11/2000 |
| JP | 2000323396 | 11/2000 |
| WO | WO 87/02603 | 5/1987 |
| WO | WO 00/31780 | 6/2000 |

OTHER PUBLICATIONS

In Situ Reactive Cleaning of X–Ray Optics by Glow Discharge, Erik D. Johnson and Richard F. Garrett, Nuclear Instruments and Methods in Physics Research A266 (1988), pp 381–385, North–Holland Physics Publishing Division, Amsterdam.

* cited by examiner

*Primary Examiner*—Hoa Q. Pham
(74) *Attorney, Agent, or Firm*—Hudak, Shunk & Farine Co. LPA

(57) ABSTRACT

EUV lithography devices do indeed have a vacuum or an inert gas atmosphere in their interior, yet the appearance of hydrocarbons and/or other carbon compounds within the device cannot be fully prevented. These carbon compounds lead to the contamination of the optical elements and a resulting loss in reflectivity. In order to counteract this, it has been suggested that while operating the EUV lithography device, the degree of contamination should be constantly monitored, e.g. using quartz crystal microwaves. Depending on the degree of contamination, oxygen is supplied to the interior of the lithography device. The oxygen, in combination with exposure radiation breaks down the contamination while the lithography device is running. The EUV lithography device is thereby equipped with at least one measuring device (3) and a connected control unit (4), which is connected to the oxygen supply (5a).

15 Claims, 2 Drawing Sheets

PROCESS AND DEVICE FOR IN-SITU DECONTAMINATION OF A EUV LITHOGRAPHY DEVICE

FIELD OF THE INVENTION

The invention concerns a process as well as a device for in-situ decontamination of an EUV lithography device.

BACKGROUND OF THE INVENTION

EUV lithography devices are used in the manufacturing of semiconductor components, e.g. integrated circuits. Lithography devices, which are operated in the wavelength range of extreme ultraviolet (e.g. at a wavelength of 13.4 nm), have primarily multi-layered systems of molybdenum and silicon, for example, as optical elements. EUV lithography devices display a vacuum or an inert gas atmosphere in their interior, however hydrocarbons and/or other carbon compounds cannot be completely prevented from appearing inside the device. These carbon compounds are split by the extreme ultraviolet radiation, leading to a film of contaminated carbons precipitating on the optical element. This contamination by carbon compounds leads to significant losses in reflectivity on the optical surface, which can have a considerable impact on the cost-efficiency of the EUV lithography process.

The problem of contamination is of great significance not only in the case of lithography devices.

In WO 87/02603 a process is described in which satellites, space shuttles, rockets and probes are cleaned during the flight, in which a stream of oxygen, i.e. a ray of oxygen ions is aimed at the external surface to be cleaned. The UV radiation from the sun is used to create additional ozone. Both the oxygen and the ozone react with the carbon contamination by volatile compounds. A sensor can be provided to steer the cleaning process, i.e. to determine when the cleaning process should be started and ended.

According to U.S. Pat. No. 5,024,968, substrates, especially silicon substrates are cleaned of contaminating carbon compounds using UV lasers with a wavelength between 200 and 300 nm. The laser focusing is controlled by the results of residual gas analyses. The substrate is thoroughly washed with inert gas to protect against renewed contamination.

In EP 0 660 188 B1, a lens system is washed with inert gases and externally produced ozone as a protective measure against contamination.

In the publication from E. D. Johnson et al., NIM A266 (1988) 381, the process of how X-ray monochromators are purified in-situ via glow discharges is explained. For this purpose, a glow discharge reactor with oxygen and water lines is connected directly to the monochromator box. The purification process lasts approximately 24 hours. The end of the cleaning process is determined by means of residual gas analyses or spectrometric measurements. A more elaborate method for determining the degree of contamination consists of pumping out the monochromator box from time to time and measuring the reflectivity of the monochromator box.

According to JP H110329931 A, the electrical resistance on the mask is measured during electron radiation lithography in order to determine if the mask must be decontaminated or not. The lithography has several masks available, so that as soon as one mask needs to be cleaned, it can be replaced by a clean mask in reserve. The mask to be cleaned is removed from the radiation process and purified in a side chamber using radiation with ultraviolet light and rinsing it with oxygen.

In EP 0 421 745 B1 a device for decontaminating optical elements is described. For this purpose, gas supply equipment as well as control equipment to select the desired wavelength range for the radiation is set up beside a reaction chamber which holds the optical element to be cleaned. In effect, oxygen and UV radiation is used to photochemically corrode the contamination based primarily of carbon compounds.

In EP 0 874 283 A2, a lithography device is described. The degree of contamination within the device is determined via transmission measurements, and in the event that a threshold value is exceeded, an in-situ purification process is initiated. The UV light used for exposure (ArF Laser, 193 nm) is used for purification. To this end, the exposure process is interrupted and an optical element, e.g. a prism, is inserted into the radiation beam path, which changes the radiation process in such a way that the greatest number of places within the lithography devices are illuminated. The atmosphere inside the lithography device is made up of nitrogen. To support the purification effect, oxygen, ozone or oxygen radicals can be mixed in with the nitrogen. The degree of contamination is also continuously monitored during purification via transmission measurements, and in the event that the threshold value is not met, the purification process is ended.

SUMMARY OF THE INVENTION

Against this background, the task of the invention submitted is to provide a process, i.e. a device for decontaminating an EUV Lithography device, by which standstill periods are avoided and equipment changes to the EUV lithography device to be cleaned are kept to a minimum.

This task is solved by a process as well as by a described herein.

Surprisingly, when it was determined that when a targeted supply of oxygen is fed to the lithography device, the radiation in the beam path used for exposure is sufficient to clean the inside of the device from contamination, as long as the degree of contamination is monitored continuously and compared with the pre-set threshold values. Depending on the actual degree of contamination, the oxygen supply is adjusted for the lithography device. The oxygen supplied is activated in the exposure beam path, spreads out via diffusion and light convection throughout the entire interior of the lithography device and reacts with the layers of contamination.

By continuously monitoring the level of contamination, it can be ensured that the purification process is initiated even if the level of contamination is so low that the normal exposure process is not yet impaired. In addition, since even minor changes in the level of contamination are detected by continually monitoring of the level of contamination, the oxygen supply can be adjusted so that very minor oxygen partial pressures are sufficient to decontaminate the EUV lithography device. This has the advantage that the oxygen is present in the lithography devices in such small amounts that the exposure process is not impacted negatively.

With the exposure radiation in the extreme ultraviolet wavelength range, especially at 13.4 nm, the oxygen molecules $O_2$ supplied are split into highly reactive oxygen atoms, which in turn oxidatively break down the contaminated film of carbon compounds on the optical element. Too strong of an oxygen supply may result in an oxidative attack on the silicon layer of the multi-layered, molybdenum—silicon system during cleaning. In this case, a layer of quartz ($SiO_2$) forms on the surface, which would also lead to a loss of reflection similar to contamination. Using the process according to the invention, however, such impairments to the surface can be prevented. Hence, with the help of the process according to the invention, just the right amount of oxygen is supplied so that the entire film of contaminating carbon and only the contamination containing carbon is removed.

The device according to the invention to decontaminate the optical elements of an EUV lithography device has at least one measuring device to measure the degree of contamination to the optical element(s) as well as a connected control device, which is connected on its side to the $O_2$ supply and is designed to compare the degree of contamination with at least one preset threshold value and to control the supply of oxygen based on the respective comparison results. Preferably, the measuring device will supply measured values for the degree of contamination on a continuous basis.

A computer is preferably used as the control device. The computer can, for example, be connected with a dosing valve that is opened and closed by computer so that doses of oxygen are added to the vacuum of the EUV lithography device at a certain pressure and at a specific flow rate. The flow measurement can, for example, can be made using a flow meter, the partial pressure measured with vacuum measurement tubes (Bayard-Alpert type, capacity measuring, etc.) or a residual gas mass spectrometer. Any potential excess oxygen or reaction products are evacuated from the pump(s) in the lithography device in any case.

In order to accelerate the decontamination process, it has been proven to be beneficial to set up at least one light source within the decontamination device to provide radiation in the wave length range between 150 nm and 300 nm. Particularly at a wavelength of 185 nm or 254 nm, highly reactive ozone is formed from the oxygen supplied. According to the invention, at least one light source 5b is connected to the control device 4, and the UV radiation dosing is regulated at the same time with the $O_2$ supply.

Fortunately the level of contamination can be measured with one or several oscillators such as quartz crystal microwave(s) 3 that react to a change in their surface mass through a change in the resonance frequency. In a preferred embodiment, at least one measuring device is shown and at least one quartz crystal microwave is arranged inside the lithography device 10. With quartz crystal microwaves, the smallest amount of contamination can be detected on a coated piezoelectric quartz.

The detection sensitivity of the quartz crystal microwaves reaches the mono and sub-mono layers. The key is correctly choosing the fundamental frequency for the piezoelectric quartz. The higher the frequency, the more sensitively the piezoelectric quartz reacts to changes in its surface mass. The contamination film on the piezoelectric quartz expresses itself in a disturbance to the base frequency of the piezoelectric quartz.

The change in frequency to the piezoelectric quartz can be traced back to the changes in mass due to the film of precipitating contamination. The change in frequency has a linear relationship to the change in mass.

In another preferred embodiment, the decontamination device has at least one additional light source 6a and at least one detector 6b, which are arranged inside the lithography device 10. The degree of contamination is then preferably determined via reflectivity measurements. The reflectivity of optical elements, in particular, is very strongly dependent on possible contamination. Apart from the high level of sensitivity toward possible contamination, this measuring method has the advantage of using reflectivity measuring to determine the most important target size for the lithography device.

In a similarly preferred embodiment, a polarizer 7a is setup in the beam path from at least one light source, near the light source and an analyzer 7b is set up near the detector. In this way, the formation of the layer of carbon contamination and its destruction using oxidative purification can be traced ellipsometrically. In this case, a helium-neon laser is selected as the light source. Its light is beamed from outside into the EUV lithography device through a corresponding port or glass window. Monitoring the density of the carbon contamination coating is possible by measuring the p- and s-polarized laser light reflected.

Another preferred embodiment consists of providing the means 8 to measure the photocurrent within the framework of the measuring device, and connecting this to optical elements in the EUV lithography device. In the event of the formation of a contaminated layer of carbons on the molybdenum-silicon, multi-layered systems in a EUV lithography device, a change in the photon stream occurs, which can be measured with radiation in the application wavelength of extreme ultraviolet, e.g. 13.4 nm.

According to another embodiment, a residual gas measuring device is included, which is connected to the control unit. Using the residual gas-measuring device, the level of contamination is determined via residual gas measurements. Since the oxygen supply and the resulting oxidative purification process removes the layer of carbon contamination, changes in the particle pressure of CO and $CO_2$ can be measured. As soon as the carbon is oxidatively cleaned off from the surface of the optical element, the corresponding particle pressures of CO and $CO_2$ fall off. The change in these particle pressures can serve as a way to measure the oxidative removal of the layer of contaminated carbons.

For decontamination of EUV lithography devices for use in manufacturing processes, in which the demands for cost-efficiency are higher than those for quality, it has proven to be sufficient within the previously described measuring method to provide a precise threshold value for the level of contamination, e.g. the density of the contamination layer. When the threshold value is exceeded, oxygen is added in a partial pressure range of $1 \times 10^{-10}$ to $1 \times 10^{-3}$ mbar. If the threshold value is not achieved, the oxygen supply is stopped. In this case, the control unit for the decontamination device can be simply set up as the discriminator switch.

In addition, to increase the quality and efficiency of the process and the device, it is of course possible to interconnect several measuring methods for determining the degree of contamination.

BRIEF DESCRIPTION OF THE DRAWINGS

The invention will be better understood and other features and advantages will become apparent by reading the detailed description of the invention, taken together with the drawings, wherein:

FIG. 1 shows a schematic illustration of a sample embodiment, in which the dotted line indicates vacuum recipient 1 within the EUV lithography device, or in larger installations, vacuum recipient 1 in which the EUV lithography device as a whole is set up. Optical element 2 and the oscillator or quartz crystal microwave 3 are set up within vacuum recipient 1. Optical element 2 involves reflectors with molybdenum-silicon, multi-layered systems for a wavelength of 13.4 nm. At this wavelength, the silicon-wafer is exposed by means of the lithography device.

Figure 1:
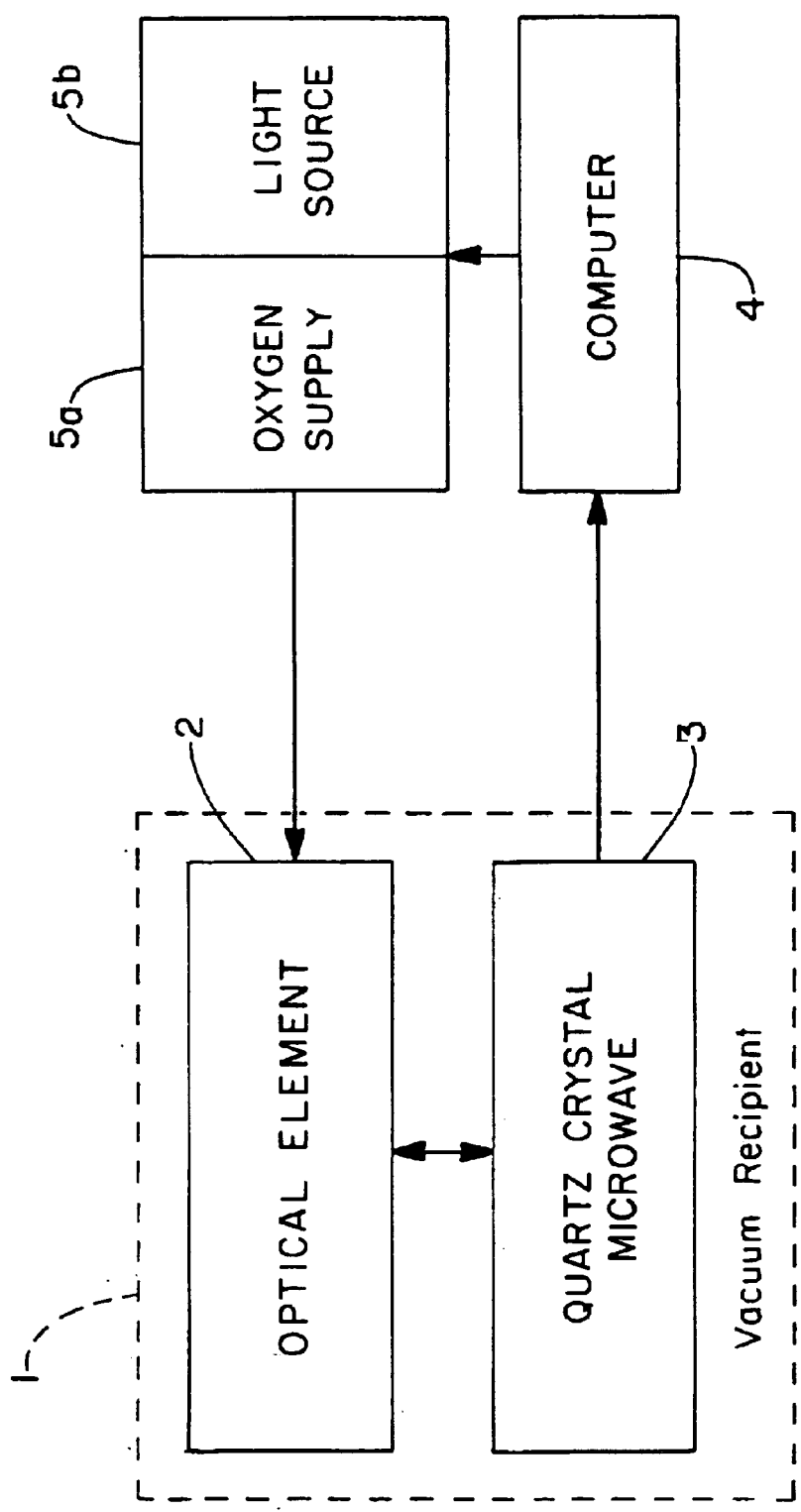
FIG. 1 is a diagram of a process for in-situ decontamination of an EUV lithography device.
Figure 2:
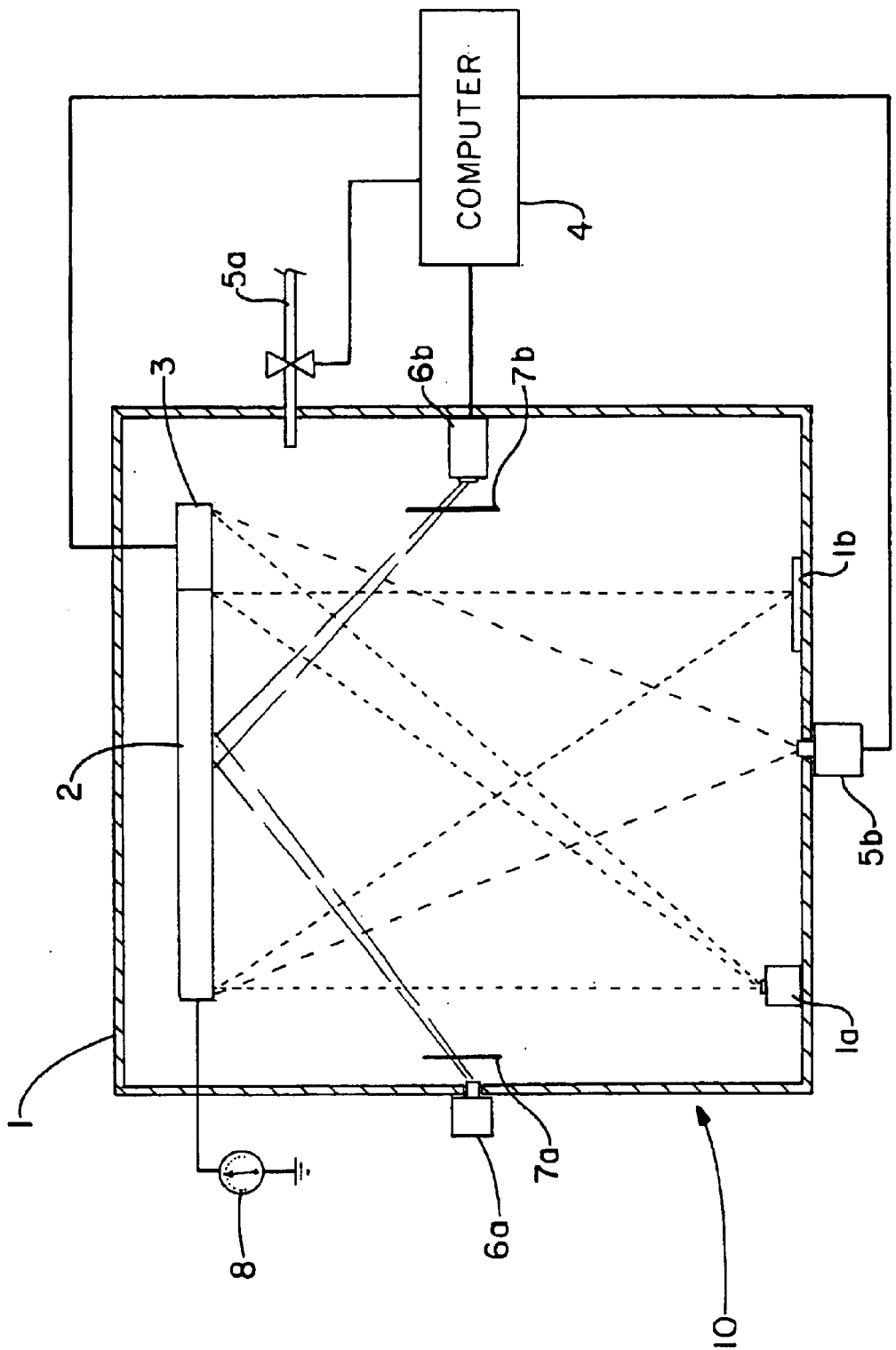
FIG. 2 is a schematic diagram one embodiment of an EUV lithography device having a device for in-situ decontamination of an optical element therein.

In order to obtain the same conditions with quartz crystal microwave 3 as for optical element 2 within the EUV lithography device, the piezoelectric quartz in quartz crystal microwave 3 is equipped with a corresponding molybdenum-silicon, multi-layered coating. Moreover, the quartz crystal microwave 3 is arranged within vacuum recipient 1 in such a way that the piezoelectric quartz is exposed to EUV radiation from source 1a of the same intensity, i.e., power density, as for optical element 2.

The formation of a contaminated film on the piezoelectric quartz leads to a disturbance in the base frequency of the piezoelectric quartz. While operating the EUV lithography device, the quartz microwave 3 continually misses the precipitating contamination from the radiation due to the corresponding frequency change, which is proportional to the mass of precipitating contamination.

Computer 4 processes the change in frequency and compares it with the original base frequency of the contamination-free piezoelectric quartz and the molybdenum-silicon multi-layered coating. As soon as a frequency deviation is present, as a result of the formation of a layer of carbon contamination, the computer opens the dosing valve for the oxygen supply 5a. The amount of oxygen fed through the dosing valve is controlled by measuring the partial pressure and flow. The mercury low-pressure lamp 5b can also be linked up as needed to produce UV radiation. The oxygen fed into vacuum recipient 1 breaks down the contamination film oxidatively. In the event that in addition to the mercury low-pressure lamp 5b, UV light is radiated into vacuum recipient 1, additional ozone is created which breaks down the contamination film anyway.

During the entire purification process, the frequency of the quartz crystal microwave 3 is measured, and computer 4 decides whether the oxygen supply should be modified and if UV radiation should be added. Toward that end, computer 4 can store parameters that indicate oxygen partial pressure and/or the intensity of the UV radiation in relation to the measured frequencies. In controlling the degree of contamination using a quartz crystal microwave, the piezoelectric quartz must be precisely temperature-controlled (better than ±1 K) in order to obtain reliable frequency measurements.

In a simple variation, the base frequency can also serve as the threshold value. In the event that the measured frequency is not the same as the basic frequency, oxygen is added; as soon as the base frequency is achieved again, the supply of oxygen is cut off.

Analogous to the embodiment samples shown in the figure, instead of the quartz crystal microwave 3, a medium can be provided to measure the photocurrent or light source and a detector to measure the reflectivity, i.e., in connection with a polarizer and analyzer to determine the density of the contamination layer ellipsometrically. In addition, while oxygen is being supplied, residual gas analyses can help determine how much contamination has already been broken down, and this data from the computer can be used to check the amount of contamination and adjust the supply of oxygen.

The above-mentioned example is only described for a quartz crystal microwave 3. Of course, quartz crystal microwaves and other measuring tools can be set up at various places within vacuum recipient 1 in order to precisely determine the degree of contamination. Accordingly, a large number of the oxygen lines and dosing valves 5a can be provided, so that various local oxygen partial pressures can be set up according to the differing degrees of contamination.

What is claimed is:

1. A process for in-situ decontamination of an EUV lithography device with the following steps:

Measuring a current degree of contamination,

Comparing the degree of contamination with at least one given threshold value,

Adjusting an $O_2$ supply to the lithography device,

Repeating the above steps, whereby all the steps are completed during the exposure operation.

2. A process according to claim 1, wherein in addition to adjusting the $O_2$ supply, UV radiation of a wavelength between 150 nm and 300 nm is radiated into the EUV lithography device.

3. A process according to claim 1, wherein the degree of contamination is measured with the help of one or several oscillators which react to a change in its surface mass by changing resonance frequency.

4. A process according to claim 1, wherein the degree of contamination is determined by reflectivity measurements.

5. A process according to claim 1, wherein the degree of contamination is determined ellipsometrically.

6. A process according to claim 1, wherein the degree of contamination is determined by measuring a stream of photons photocurrent.

7. A process according to claims 1, wherein the degree of contamination is determined while oxygen is being supplied.

8. A process according to claim 1, wherein a precise threshold value is given, whereby exceeding the threshold value results in oxygen in a partial pressure range between $1 \times 10^{-10}$ mbar to $1 \times 10^{-3}$ mbar being added, and in the event that the threshold is not reached, the supply of oxygen being stopped.

9. A device for in-situ decontamination of optical elements in an EUV lithography device, comprising: at least one measuring device to measure a degree of contamination of the optical element(s) and a connected control unit, which is connected to a device to supply $O_2$ to the EUV lithography device, and which is set up to compare the measured degree of contamination with at least one pre-set threshold value, and to control the supply of oxygen in relation to the corresponding comparison results.

10. A device according to claim 9, wherein the device has at least one light source for radiation in the wave length range between 150 nm and 300 nm.

11. A device according to claim 9, wherein at least one measuring device has at least one quartz crystal microwave set up inside the lithography device.

12. A device according to claim 9, wherein the measuring device has at least one additional light source and at least one detector, which are set up within the lithography device.

13. A device according to claim 12, wherein a polarizer is set up in the beam path of at least one light source, near the light source, and an analyzer is set up near the detector.

14. A device according to claim 9, wherein the measuring device has the means to measure photocurrent that is connected to an optical element in the EUV lithography device.

15. A device according to claims 9, wherein a measuring device connected to the control unit is set up as a residual gas-measuring device.

* * * * *

UNITED STATES PATENT AND TRADEMARK OFFICE
CERTIFICATE OF CORRECTION

PATENT NO. : 6,781,685 B2
DATED : August 24, 2004
INVENTOR(S) : Uwe W. Hamm

It is certified that error appears in the above-identified patent and that said Letters Patent is hereby corrected as shown below:

Title page,
Item [57], ABSTRACT,
Line 9, please replace the term "microwaves" with -- microscales --.

Drawings
FIG. 1, please replace the term "microwave" with -- microscale --.

Column 3,
Line 41, please replace the term "microwave(s)" with -- microscale(s) --.
Line 44, please replace the term "microwave" with -- microscale --.
Lines 45 and 48, please replace the term "microwaves" with -- microscales --.

Column 4,
Line 22, please replace "photon stream" with -- photocurrent --.

Column 5,
Lines 4, 10, 12, 14, 21, 41, 47 and 56, please replace the term "microwave" with -- microscale --.

Column 5, line 67 thru Column 6, line 1,
Please replace the term "microwave" and "microwaves" with -- microscale -- and -- microscales --.

Column 6,
Lines 29 and 30, please delete "a stream of photons"
Line 52, please replace the term "microwave" with -- microscale --.

Signed and Sealed this

Seventh Day of December, 2004

JON W. DUDAS
*Director of the United States Patent and Trademark Office*